(12) United States Patent
Zhou et al.

(10) Patent No.: US 11,652,162 B2
(45) Date of Patent: May 16, 2023

(54) METHOD OF FORMING A THREE-GATE NON-VOLATILE FLASH MEMORY CELL USING TWO POLYSILICON DEPOSITION STEPS

(71) Applicant: Silicon Storage Technology, Inc., San Jose, CA (US)

(72) Inventors: Feng Zhou, Fremont, CA (US); Xian Liu, Sunnyvale, CA (US); Chien-Sheng Su, Saratoga, CA (US); Nhan Do, Saratoga, CA (US); Chunming Wang, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 64 days.

(21) Appl. No.: 17/021,678

(22) Filed: Sep. 15, 2020

(65) Prior Publication Data

US 2020/0411673 A1 Dec. 31, 2020

Related U.S. Application Data

(62) Division of application No. 16/245,069, filed on Jan. 10, 2019, now abandoned, which is a division of
(Continued)

(30) Foreign Application Priority Data

Apr. 20, 2016 (CN) .......................... 201610247666.6

(51) Int. Cl.
*H01L 29/66* (2006.01)
*H01L 29/788* (2006.01)
(Continued)

(52) U.S. Cl.
CPC .... *H01L 29/66825* (2013.01); *H01L 27/0705* (2013.01); *H01L 28/00* (2013.01);
(Continued)

(58) Field of Classification Search
CPC ..... H01L 21/823864; H01L 21/823468; H01L 21/823807; H01L 21/823814;
(Continued)

(56) References Cited

U.S. PATENT DOCUMENTS 5,070,032 A * 12/1991 Yuan ................. H01L 27/11519
438/588
5,095,344 A * 3/1992 Harari ................. H01L 29/7885
365/185.27
(Continued)

FOREIGN PATENT DOCUMENTS

JP 2000 286348 10/2000
KR 20020095356 12/2002
(Continued)

*Primary Examiner* — Sophia T Nguyen
(74) *Attorney, Agent, or Firm* — DLA Piper LLP (US)

(57) ABSTRACT

A simplified method for forming a non-volatile memory cell using two polysilicon depositions. A first polysilicon layer is formed on and insulated from the semiconductor substrate in a first polysilicon deposition process. An insulation block is formed on the first polysilicon layer. Spacers are formed adjacent first and second sides of the insulation block, and with the spacer adjacent the first side is reduced. Exposed portions of the first poly silicon layer are removed while maintaining a polysilicon block of the first polysilicon layer disposed under the insulation block. A second polysilicon layer is formed over the substrate and the insulation block in a second polysilicon deposition process. Portions of the second polysilicon layer are removed while maintaining a first polysilicon block (disposed adjacent the first side of the insulation block), and a second polysilicon block (disposed adjacent the second side of the insulation block).

6 Claims, 19 Drawing Sheets

Related U.S. Application Data application No. 15/474,879, filed on Mar. 30, 2017, now Pat. No. 10,217,850.

(51) Int. Cl.

| | | |
|---|---|---|
| *H01L 27/07* | (2006.01) | |
| *H01L 29/08* | (2006.01) | |
| *H01L 21/28* | (2006.01) | |
| *H01L 49/02* | (2006.01) | |
| *H01L 29/423* | (2006.01) | |

(52) U.S. Cl.
CPC .... *H01L 29/0847* (2013.01); *H01L 29/40114* (2019.08); *H01L 29/42328* (2013.01); *H01L 29/66545* (2013.01); *H01L 29/788* (2013.01); *G11C 2216/10* (2013.01); *H01L 29/6653* (2013.01)

(58) Field of Classification Search
CPC ..... H01L 21/823418; H01L 21/823412; H01L 29/66659; H01L 29/42328; H01L 29/66825; H01L 29/42336; H01L 29/66545; H01L 27/11536; H01L 27/11541

See application file for complete search history.

(56) References Cited

U.S. PATENT DOCUMENTS

| | | | |
|---|---|---|---|
| 5,101,250 A * | 3/1992 | Arima | H01L 27/11521 |
| | | | 365/185.26 |
| 5,268,319 A * | 12/1993 | Harari | G11C 16/3495 |
| | | | 438/266 |
| 6,043,530 A * | 3/2000 | Chang | H01L 27/105 |
| | | | 257/E27.081 |
| 6,338,993 B1 | 1/2002 | Lien | |
| 6,403,424 B1 | 6/2002 | Lee | |
| 6,476,440 B1 * | 11/2002 | Shin | G11C 16/0433 |
| | | | 438/257 |
| 6,486,509 B1 * | 11/2002 | Van Houdt | G11C 16/0425 |
| | | | 257/314 |
| 6,541,324 B1 * | 4/2003 | Wang | H01L 27/11534 |
| | | | 438/258 |
| 6,563,167 B2 * | 5/2003 | Chern | H01L 27/115 |
| | | | 257/317 |
| 6,747,310 B2 | 6/2004 | Fan | |
| 6,855,980 B2 * | 2/2005 | Wang | H01L 29/66825 |
| | | | 257/E21.422 |
| 6,876,031 B1 * | 4/2005 | Kao | G11C 16/0416 |
| | | | 365/185.26 |
| 6,992,929 B2 | 1/2006 | Chen | |
| 7,242,051 B2 | 7/2007 | Widjaja | |
| 7,315,056 B2 | 1/2008 | Klinger | |
| 7,611,941 B1 | 11/2009 | Shum | |
| 7,718,488 B2 | 5/2010 | Chen | |
| 7,800,159 B2 | 9/2010 | Widjaja | |
| 7,834,390 B2 | 11/2010 | Nagai | |
| 8,008,702 B2 * | 8/2011 | Wang | H01L 29/7881 |
| | | | 257/314 |
| 8,058,680 B2 | 11/2011 | Io | |
| 8,059,473 B2 * | 11/2011 | Jeon | H01L 29/42328 |
| | | | 257/314 |
| 8,138,524 B2 * | 3/2012 | Kotov | H01L 29/7885 |
| | | | 438/467 |
| 8,421,141 B2 | 4/2013 | Hsu | |
| 8,669,607 B1 * | 3/2014 | Tsair | H01L 29/40114 |
| | | | 438/257 |
| 9,190,532 B2 | 11/2015 | Wang | |
| 9,245,638 B2 * | 1/2016 | Do | G11C 16/26 |
| 9,252,150 B1 | 2/2016 | Shih | |
| 9,276,006 B1 | 3/2016 | Chen | |
| 9,287,282 B2 | 3/2016 | Hsieh | |
| 9,306,039 B2 | 4/2016 | Tadayoni | |
| 9,356,032 B2 | 5/2016 | Mizushima | |
| 9,379,121 B1 | 6/2016 | Chen | |
| 9,406,687 B1 * | 8/2016 | Yang | H01L 29/7881 |
| 9,548,312 B1 * | 1/2017 | Beyer | H01L 27/11524 |
| 9,583,499 B1 | 2/2017 | Zhu | |
| 9,614,048 B2 | 4/2017 | Wu | |
| 9,673,208 B2 * | 6/2017 | Kim | H01L 27/11546 |
| 9,728,544 B2 * | 8/2017 | Yu | H01L 27/11521 |
| 9,741,728 B2 * | 8/2017 | Chuang | H01L 29/788 |
| 9,793,279 B2 * | 10/2017 | Yang | H01L 29/7881 |
| 9,793,281 B2 | 10/2017 | Su | |
| 9,917,165 B2 | 3/2018 | Wu | |
| 10,217,850 B2 * | 2/2019 | Zhou | H01L 29/788 |
| 10,424,589 B2 * | 9/2019 | Walls | H01L 29/66825 |
| 10,475,891 B2 * | 11/2019 | Liu | H01L 29/7835 |
| 10,553,596 B2 * | 2/2020 | Bo | G11C 16/0425 |
| 10,608,090 B2 * | 3/2020 | Yang | H01L 29/665 |
| 10,644,139 B2 * | 5/2020 | Wang | H01L 29/423 |
| 10,714,634 B2 * | 7/2020 | Yang | H01L 29/4916 |
| 10,861,550 B1 * | 12/2020 | Daryanani | H01L 29/40114 |
| 10,868,197 B1 * | 12/2020 | Yi | H01L 29/66825 |
| 11,056,495 B2 * | 7/2021 | Yi | H01L 27/11521 |
| 2002/0034846 A1 * | 3/2002 | Wang | H01L 27/11521 |
| | | | 257/E21.422 |
| 2002/0034849 A1 * | 3/2002 | Wang | H01L 29/66825 |
| | | | 438/257 |
| 2002/0102774 A1 * | 8/2002 | Kao | H01L 27/115 |
| | | | 438/142 |
| 2002/0110983 A1 * | 8/2002 | Liu | H01L 29/7881 |
| | | | 438/257 |
| 2002/0142545 A1 * | 10/2002 | Lin | H01L 27/11521 |
| | | | 438/257 |
| 2004/0065917 A1 * | 4/2004 | Fan | H01L 27/11521 |
| | | | 257/315 |
| 2004/0185615 A1 | 9/2004 | Ding | |
| 2004/0256657 A1 | 12/2004 | Hung | |
| 2005/0199956 A1 * | 9/2005 | Ding | H01L 29/66825 |
| | | | 438/257 |
| 2005/0259474 A1 | 11/2005 | Lee | |
| 2005/0269622 A1 * | 12/2005 | Klinger | H01L 29/7885 |
| | | | 257/315 |
| 2006/0019445 A1 | 1/2006 | Chen | |
| 2006/0113584 A1 * | 6/2006 | Fukuda | H01L 29/40114 |
| | | | 257/E21.209 |
| 2006/0244042 A1 * | 11/2006 | Jeon | H01L 27/11521 |
| | | | 257/E29.302 |
| 2006/0261399 A1 | 11/2006 | Widjaja | |
| 2007/0093024 A1 * | 4/2007 | Fu | H01L 29/7886 |
| | | | 438/257 |
| 2007/0194366 A1 | 8/2007 | Kuo | |
| 2007/0257299 A1 | 11/2007 | Chen | |
| 2008/0006870 A1 * | 1/2008 | Yang | H01L 21/845 |
| | | | 438/257 |
| 2008/0083945 A1 * | 4/2008 | Klinger | H01L 29/42328 |
| | | | 257/E27.103 |
| 2008/0093647 A1 * | 4/2008 | Kang | H01L 29/66825 |
| | | | 257/314 |
| 2008/0111181 A1 * | 5/2008 | Park | H01L 29/40114 |
| | | | 257/E21.422 |
| 2008/0149985 A1 * | 6/2008 | Liu | H01L 29/40114 |
| | | | 438/257 |
| 2008/0217675 A1 * | 9/2008 | Liu | H01L 27/115 |
| | | | 257/E29.302 |
| 2009/0039410 A1 * | 2/2009 | Liu | H01L 29/66825 |
| | | | 257/320 |
| 2009/0098721 A1 * | 4/2009 | Liu | H01L 29/7881 |
| | | | 257/E21.294 |
| 2009/0108328 A1 * | 4/2009 | Widjaja | H01L 29/7881 |
| | | | 257/E27.081 |
| 2009/0200594 A1 * | 8/2009 | Nagai | H01L 29/66825 |
| | | | 257/316 |
| 2009/0207662 A1 * | 8/2009 | Wang | H01L 29/7881 |
| | | | 438/257 |
| 2009/0294832 A1 * | 12/2009 | Kakoschke | H01L 29/42328 |
| | | | 257/324 |
| 2010/0308392 A1 * | 12/2010 | Nagai | H01L 29/42324 |
| | | | 257/E21.409 |

(56) References Cited

U.S. PATENT DOCUMENTS

| | | | |
|---|---|---|---|
| 2011/0006355 A1 | 1/2011 | Shen | |
| 2011/0049603 A1 | 3/2011 | Pan | |
| 2011/0049605 A1* | 3/2011 | Ishiguro | H01L 29/7885 257/E21.209 |
| 2011/0286284 A1* | 11/2011 | Wang | H01L 27/11521 438/257 |
| 2012/0119281 A1 | 5/2012 | Tan | |
| 2012/0261736 A1* | 10/2012 | Hsu | H01L 29/66825 257/E21.409 |
| 2013/0032872 A1 | 2/2013 | Kotov | |
| 2013/0207174 A1 | 8/2013 | Wang | |
| 2013/0313626 A1* | 11/2013 | Huang | H01L 29/7881 257/E27.06 |
| 2014/0015029 A1 | 1/2014 | Hsu | |
| 2014/0057422 A1 | 2/2014 | Liu | |
| 2014/0091382 A1 | 4/2014 | Tadayoni | |
| 2014/0126299 A1 | 5/2014 | Fukumoto | |
| 2014/0151782 A1* | 6/2014 | Tsair | H01L 27/11524 438/593 |
| 2014/0217489 A1* | 8/2014 | Wang | H01L 29/788 257/315 |
| 2014/0239367 A1* | 8/2014 | Saito | H01L 29/0642 438/266 |
| 2014/0264538 A1* | 9/2014 | Yu | H01L 29/42328 438/266 |
| 2014/0264539 A1 | 9/2014 | Do | |
| 2015/0008451 A1 | 1/2015 | Su | |
| 2015/0014761 A1 | 1/2015 | Hsu | |
| 2015/0035040 A1* | 2/2015 | Yoo | H01L 29/42328 438/593 |
| 2015/0060989 A1 | 3/2015 | Loiko | |
| 2015/0091073 A1 | 4/2015 | Li | |
| 2015/0117109 A1 | 4/2015 | La Rosa | |
| 2015/0137207 A1 | 5/2015 | Chuang | |
| 2015/0194519 A1* | 7/2015 | Wada | H01L 27/11534 438/257 |
| 2015/0206891 A1 | 7/2015 | Chuang | |
| 2015/0263040 A1* | 9/2015 | Su | H01L 27/1207 438/157 |
| 2015/0270273 A1* | 9/2015 | Ma | H01L 27/11521 438/257 |
| 2015/0349096 A1 | 12/2015 | Winstead | |
| 2015/0364558 A1 | 12/2015 | Wu | |
| 2015/0372121 A1 | 12/2015 | Chen | |
| 2016/0064394 A1* | 3/2016 | Chu | H01L 27/11543 438/258 |
| 2016/0126247 A1 | 5/2016 | Kim | |
| 2016/0133639 A1* | 5/2016 | Tran | G11C 16/26 257/319 |
| 2016/0141296 A1* | 5/2016 | Yang | H01L 29/66825 257/316 |
| 2016/0141407 A1* | 5/2016 | Chiba | H01L 21/32139 438/257 |
| 2016/0148944 A1* | 5/2016 | Yu | H01L 29/7881 438/587 |
| 2016/0163552 A1* | 6/2016 | Hsu | H01L 29/42328 257/316 |
| 2016/0163722 A1 | 6/2016 | Chang | |
| 2016/0181266 A1* | 6/2016 | Chuang | H01L 21/32139 257/316 |
| 2016/0190268 A1 | 6/2016 | Wu | |
| 2016/0197088 A1* | 7/2016 | Chen | H01L 29/511 257/316 |
| 2016/0204274 A1* | 7/2016 | Fan | H01L 21/26513 257/319 |
| 2016/0217849 A1 | 7/2016 | Do | |
| 2016/0218110 A1 | 7/2016 | Yang | |
| 2016/0240622 A1 | 8/2016 | Fan | |
| 2016/0260728 A1 | 9/2016 | Chen | |
| 2016/0293260 A1* | 10/2016 | Tran | G11C 16/24 |
| 2017/0012049 A1 | 1/2017 | Yang | |
| 2017/0025424 A1* | 1/2017 | Su | H01L 27/11521 |
| 2017/0025427 A1* | 1/2017 | Su | H01L 27/11524 |
| 2017/0047336 A1* | 2/2017 | Zaka | H01L 27/11539 |
| 2017/0062446 A1* | 3/2017 | Kodama | H01L 29/40114 |
| 2017/0062448 A1* | 3/2017 | Kitajima | H01L 21/32133 |
| 2017/0098654 A1 | 4/2017 | Zhou | |
| 2017/0103991 A1 | 4/2017 | Kim | |
| 2017/0125432 A1* | 5/2017 | Richter | H01L 21/76283 |
| 2017/0125603 A1* | 5/2017 | Zhou | H01L 29/7883 |
| 2017/0194336 A1 | 7/2017 | Lin | |
| 2017/0221911 A1* | 8/2017 | Yi | H01L 29/7883 |
| 2017/0301683 A1* | 10/2017 | Chen | H01L 27/11546 |
| 2017/0317093 A1* | 11/2017 | Wang | H01L 27/11521 |
| 2017/0330889 A1* | 11/2017 | Richter | H01L 27/11519 |
| 2017/0345832 A1* | 11/2017 | Wu | H01L 29/6653 |
| 2018/0012898 A1 | 1/2018 | Wu | |
| 2018/0069104 A1* | 3/2018 | Zhou | H01L 29/40114 |
| 2018/0102414 A1* | 4/2018 | Liu | H01L 29/42328 |
| 2018/0233509 A1* | 8/2018 | Cai | H01L 27/1156 |
| 2019/0097027 A1* | 3/2019 | Hymas | H01L 21/31053 |
| 2019/0103470 A1* | 4/2019 | Yang | H01L 29/665 |
| 2019/0148529 A1* | 5/2019 | Zhou | H01L 29/0847 438/266 |
| 2019/0206881 A1* | 7/2019 | Hymas | H01L 29/40114 |
| 2020/0411673 A1* | 12/2020 | Zhou | H01L 29/788 |

FOREIGN PATENT DOCUMENTS

| | | |
|---|---|---|
| TW | 2013 51618 A | 12/2013 |
| TW | 2015 41563 A | 11/2015 |
| TW | 2016 13073 A | 4/2016 |

\* cited by examiner

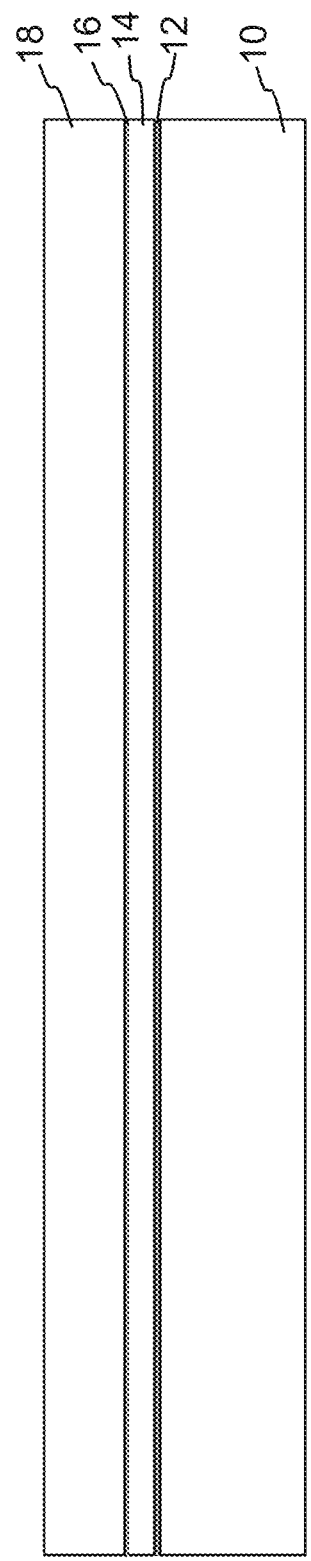
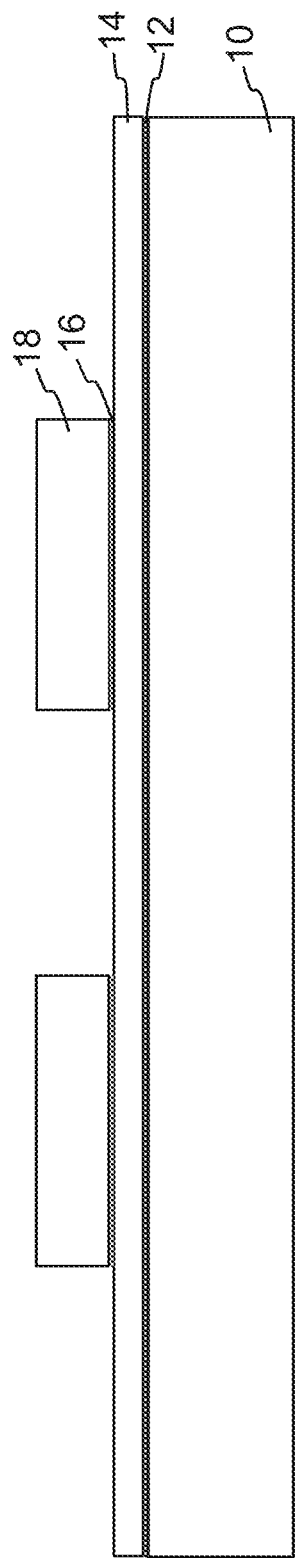
FIG. 1A
FIG. 1B

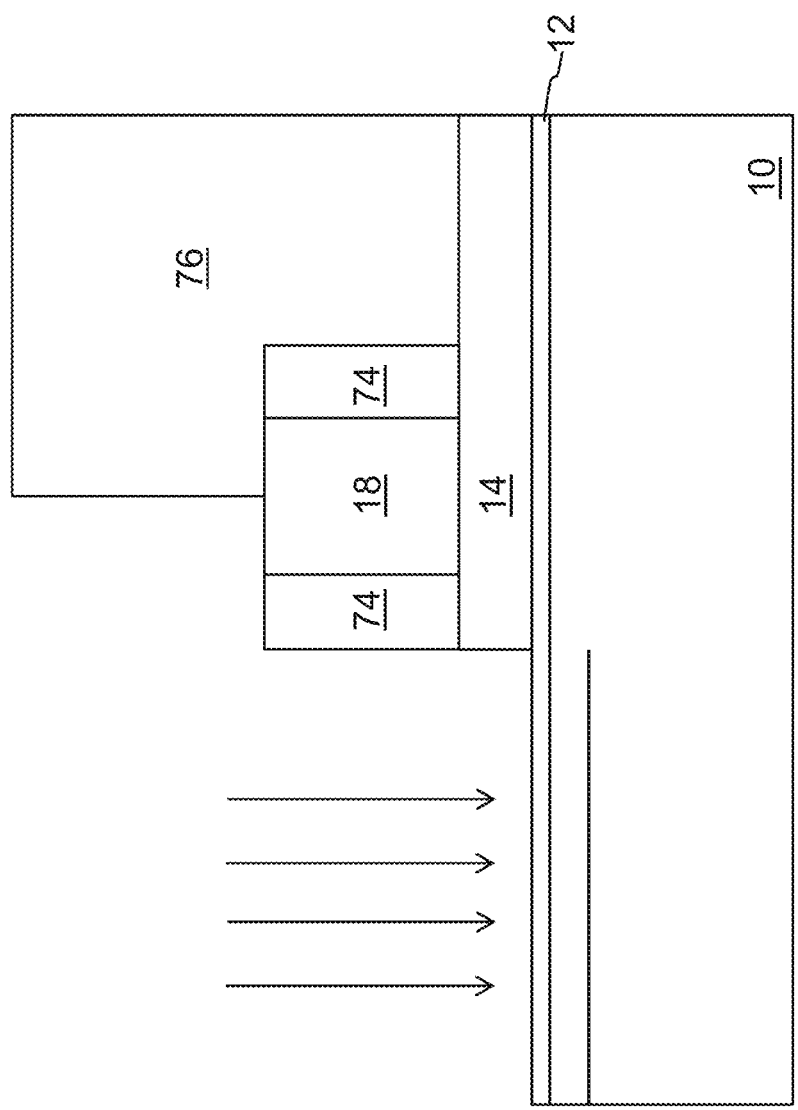

METHOD OF FORMING A THREE-GATE NON-VOLATILE FLASH MEMORY CELL USING TWO POLYSILICON DEPOSITION STEPS

RELATED APPLICATION

This application is a divisional of Ser. No. 16/245,069, filed Jan. 10, 2019, which is a divisional of Ser. No. 15/474,879, filed Mar. 30, 2017, which claims the benefit of Chinese Patent Application No. 201610247666.6 filed on Apr. 20, 2016, which are incorporated herein by reference.

TECHNICAL FIELD

The present invention relates to a non-volatile flash memory cell which has a word line (WL) gate, a floating gate, and an erase gate.

BACKGROUND OF THE INVENTION

Split gate non-volatile flash memory cells having a word line (WL) gate, a floating gate, and an erase gate are well known in the art. See for example U.S. Pat. No. 7,315,056, which is incorporated herein by reference in its entirety.

As non-volatile memory cells have reduced in size, it becomes more challenging to fabricate such memory cells in terms of self-aligned elements, and reduced numbers of processing steps (e.g. masking steps, poly deposition steps, etc.). Accordingly, it is one of the objectives of the present invention to simplify the fabrication process as the memory cells continue to shrink in size.

SUMMARY OF THE INVENTION

A simplified method of forming a pair of non-volatile memory cells includes forming a first insulation layer on a semiconductor substrate, forming a first polysilicon layer on the first insulation layer in a first polysilicon deposition process, forming a pair of spaced apart insulation blocks on the first polysilicon layer, each of the insulation blocks having first sides facing toward each other and second sides facing away from each other, forming insulation spacers adjacent the first and second sides, reducing a width of the insulation spacers adjacent the first sides, removing portions of the first polysilicon layer while maintaining a pair of polysilicon blocks of the first polysilicon layer each disposed under one of the pair of insulation blocks and the insulation spacers adjacent the first and second sides of the one insulation block, forming a source region in the substrate and between the pair of insulation blocks, removing the insulation spacers to expose end portions of each of the pair of polysilicon blocks of the first polysilicon layer, forming a layer of insulation material that at least extends along the exposed end portions of each of the pair of polysilicon blocks of the first polysilicon layer, forming a second polysilicon layer over the substrate and the pair of insulation blocks in a second polysilicon deposition process, removing portions of the second polysilicon layer while maintaining a first polysilicon block, a second polysilicon block and a third polysilicon block of the second polysilicon layer (wherein the first polysilicon block is disposed between the pair of insulation blocks and over the source region, the second polysilicon block is disposed adjacent the second side of one of the insulation blocks, and the third polysilicon block is disposed adjacent the second side of another one of the insulation blocks), forming a first drain region in the substrate and adjacent the second polysilicon block, and forming a second drain region in the substrate and adjacent the third polysilicon block.

A simplified method of forming a pair of non-volatile memory cells includes forming a first insulation layer on a semiconductor substrate, forming a first polysilicon layer on the first insulation layer in a first polysilicon deposition process, forming an insulation block on the first polysilicon layer having opposing first and second sides, forming a first insulation spacer on the first polysilicon layer and adjacent the first side and a second insulation spacer on the first polysilicon layer and adjacent the second side, removing portions of the first polysilicon layer while maintaining a polysilicon block of the first polysilicon layer disposed under the insulation block and first and second insulation spacers, removing the insulation block, removing a portion of the first polysilicon layer disposed between the first and second insulation spacers to form a first polysilicon block of the first polysilicon layer disposed under the first insulation spacer and a second polysilicon block of the first polysilicon layer disposed under the second insulation spacer, forming a source region in the substrate and between the first and second insulation spacers, forming insulation material that at least extends along an end portion of each of the first and second polysilicon blocks of the first polysilicon layer, forming a second polysilicon layer over the substrate and the pair of insulation spacers in a second polysilicon deposition process, removing portions of the second polysilicon layer while maintaining a third polysilicon block, a fourth polysilicon block and a fifth polysilicon block of the second polysilicon layer (wherein the third polysilicon block is disposed between the pair of insulation spacers and over the source region, the fourth polysilicon block is disposed adjacent the first insulation spacer, and the fifth polysilicon block is disposed adjacent the second insulation spacer), forming a first drain region in the substrate and adjacent the fourth polysilicon block, and forming a second drain region in the substrate and adjacent the fifth polysilicon block.

Other objects and features of the present invention will become apparent by a review of the specification, claims and appended figures.

BRIEF DESCRIPTION OF THE DRAWINGS

FIGS. 1A-1I are cross sectional views illustrating steps in forming a pair of memory cells of the present invention.

FIGS. 4A-4D are cross sectional views illustrating steps in another alternate embodiment for forming a pair of memory cells of the present invention.

DETAILED DESCRIPTION OF THE INVENTION

Figure 1C:
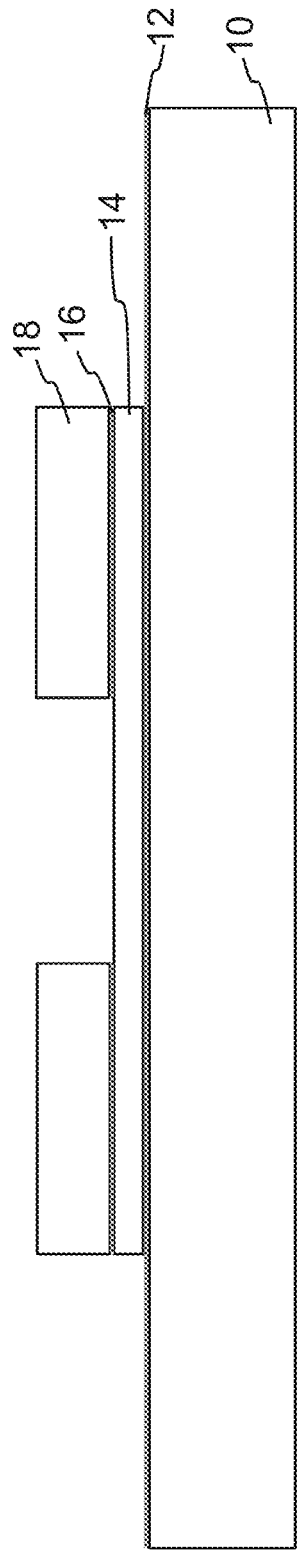

The present invention is a method of making pairs of memory cells with a reduced numbers of processing steps (e.g. only two polysilicon deposition steps). Referring to FIGS. 1A-1I, there are shown cross-sectional views of the steps in the process to make pairs of memory cells (while only the formation of a single pair of memory cells are shown in the figures, it should be understood that an array of such memory cell pairs are formed concurrently). The process begins by forming a layer of silicon dioxide (oxide) 12 on a substrate 10 of P type single crystalline silicon. The oxide layer 12 can be 80-100 A thick. Thereafter a layer 14 of polysilicon (or amorphous silicon) is formed on the layer 12 of silicon dioxide. Poly layer 14 can be 200-300 A thick. Another insulating layer 16 (e.g. oxide) is formed on poly layer 14, and yet another insulating layer 18 (e.g. silicon nitride (nitride)) is formed on oxide layer 16, as shown in FIG. 1A. Oxide layer 16 can be 20-50 A thick, and nitride layer 18 can be about 500 A thick.

Photoresist material (not shown) is coated on the structure, and a masking step is performed exposing selected portions of the photoresist material. The photoresist is developed such that portions of the photoresist are removed. Using the remaining photoresist as a mask, the structure is etched. Specifically, nitride and oxide layers 18 and 16 are anisotropically etched (using poly layer 14 as an etch stop), leaving pairs of nitride blocks 18 as shown in FIG. 1B (after the photoresist is removed). The space between nitride blocks 18 is termed herein the "inner region," and the spaces outside of the pair of nitride blocks are termed herein the "outer regions." Photoresist material is again coated on the structure, and is patterned using masking and develop steps, to cover the inner region. An anisotropic poly etch is then used to remove those portions of poly layer 14 in the outer regions, as shown in FIG. 1C (after the photoresist is removed).

Figure 1D:
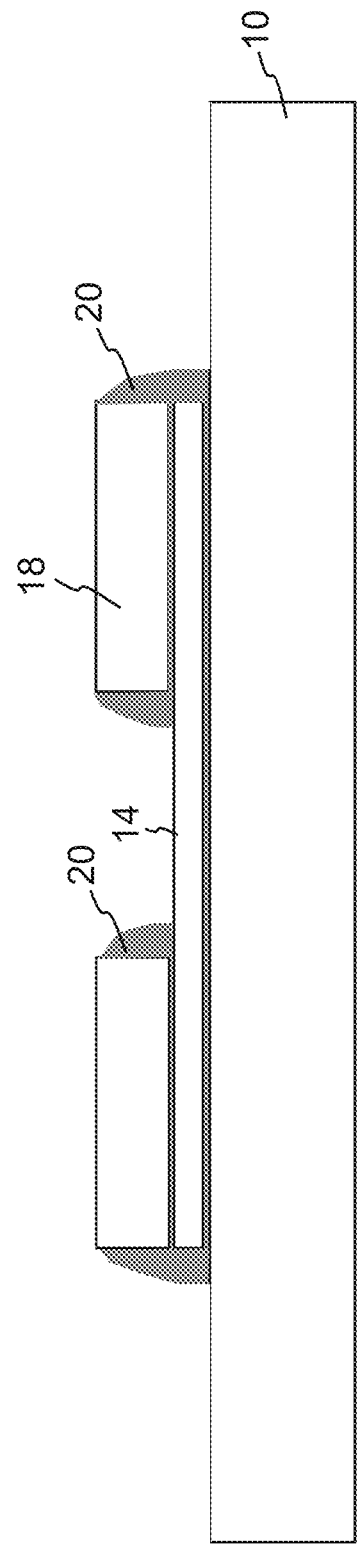
Figure 1E:
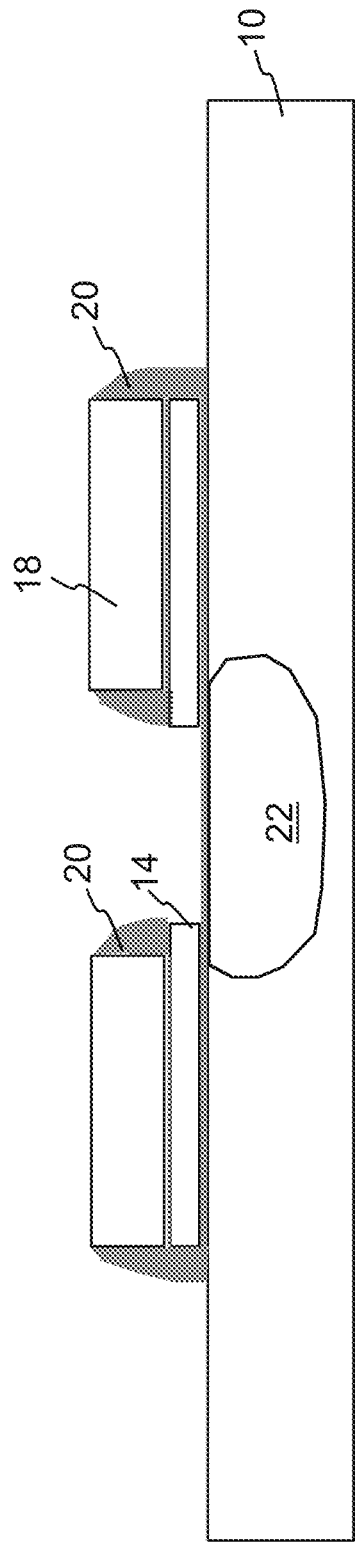

Oxide spacers 20 are then formed on the sides of the structure. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). The resultant structure is shown in FIG. 1D. A poly etch is then used to remove the exposed portion of poly layer 14 in the inner region. An implant process (e.g. implantation and anneal) is then performed to form source region 22 in the substrate in the inner region. The resulting structure is shown in FIG. 1E.

Figure 1F:
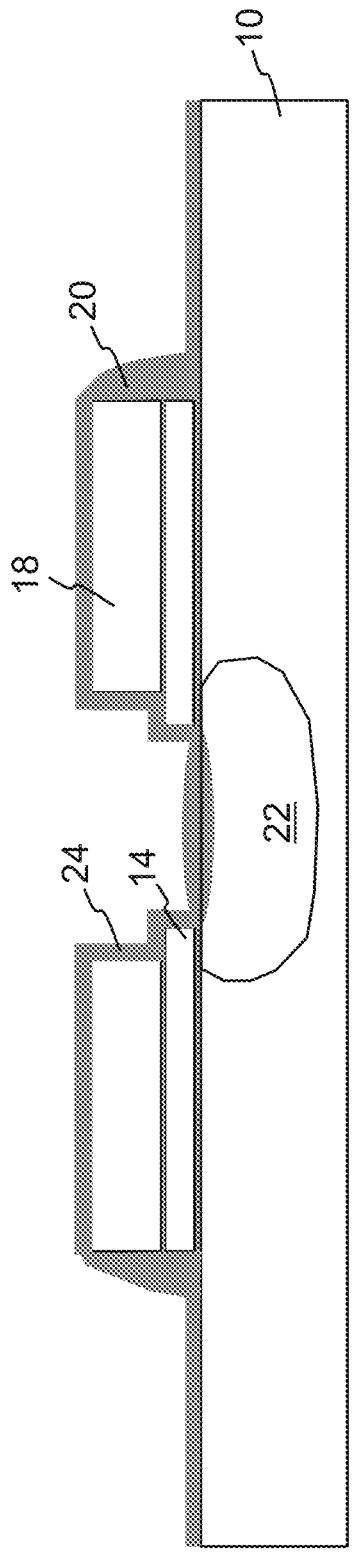
Figure 1G:
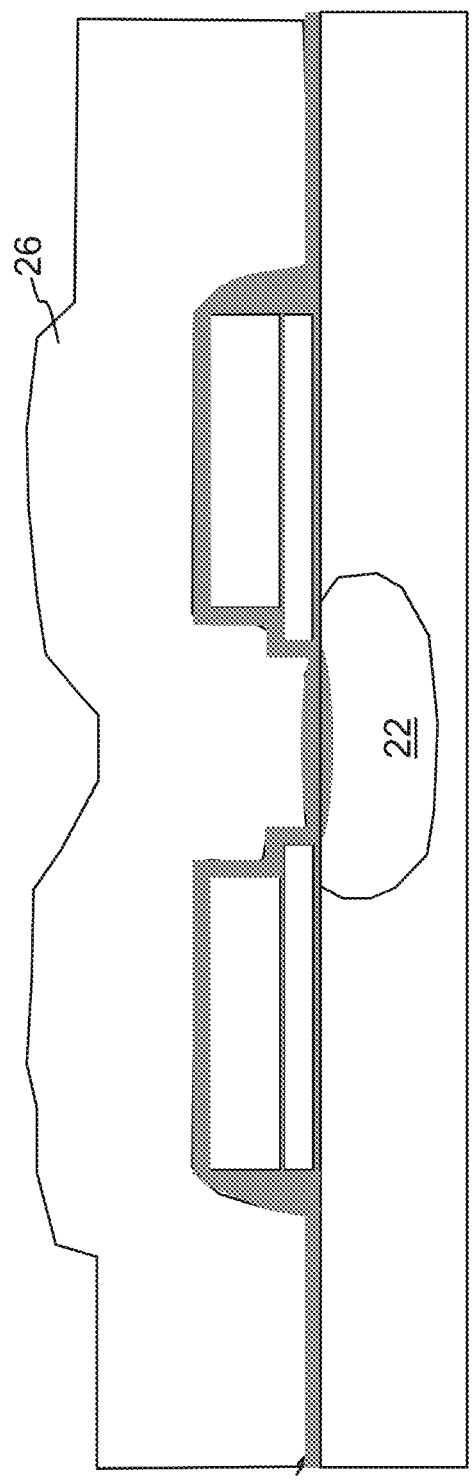
Figure 1H:
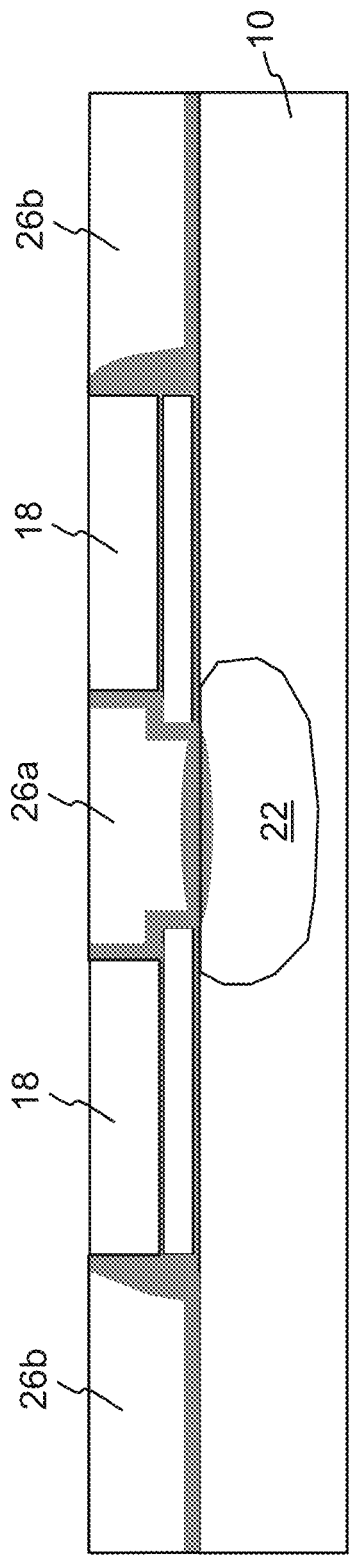

Photoresist is formed on the structure and removed from the inner region, and an oxide etch is used to remove the oxide spacers 20 in the inner region and the oxide layer 12 over the source region. After photoresist removal, a tunnel oxide layer 24 is then formed over the structure (e.g. by high temperature oxide HTO), including the exposed portions of poly layer 14 in the inner region, as shown in FIG. 1F. A thick layer 26 of polysilicon is formed over the structure (see FIG. 1G), followed by a poly etch (e.g. CMP using nitride 18 as an etch stop), leaving a poly block 26a in the inner region and poly blocks 26b in the outer regions, as shown in FIG. 1H. An optional poly etch could be used to reduce the height of poly blocks 26a and 26b (i.e. below the tops of nitride blocks 18).

Figure 1I:
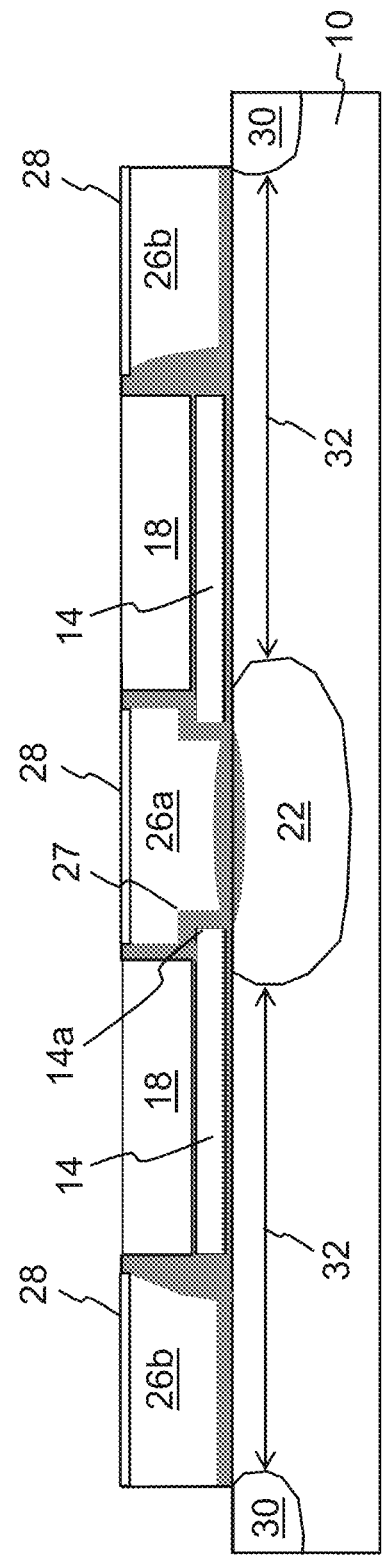

Photoresist is formed on the structure and patterned to leave portions of poly blocks 26b exposed, followed by a poly etch to remove exposed portions of poly blocks 26 (i.e. to define the outside edges of poly blocks 26b). An implant is then performed to form drain regions 30 in the substrate adjacent the outside edges of poly blocks 26b. Salicide 28 is then formed on the exposed upper surfaces of poly blocks 26a and 26b (for improved conductivity). The final structure is shown in FIG. 1I, and includes a pair of memory cells. Each memory cell includes a source region 22, a drain region 30, a channel region 32 in the substrate between the source and drain regions, a floating gate 14 disposed over and insulated from a first portion of the channel region 32, a word line gate 26b disposed over and insulated from a second portion of the channel region 32, and an erase gate 26a disposed over and insulated from the source region 22. The erase gate 26a has a first portion that is laterally adjacent to the floating gate 14 and a second portion that extends up and over a portion of the floating gate 14.

The above described manufacturing method has several advantages. First, only two poly depositions are used to form all three gates (floating 14, erase 26a and word line 26b). The floating gate 14 has a sharp tip or edge 14a facing a notch 27 in the erase gate 26a for improved erase efficiency. The floating gate 14 is relatively thin, while the nitride block 18 above the floating gate 14 is relatively thick and acts as a reliable hard mask and serves as a poly CMP stop layer.

Referring to FIGS. 2-7, there are shown cross-sectional views of alternate embodiments of the process to make pairs of memory cells (while only the formation of one memory cell is shown in these figures, it should be understood that a mirror memory cell is concurrently formed on the other side of the source region as part of a pair of memory cells, and that an array of such memory cell pairs are formed concurrently).

Figure 2:
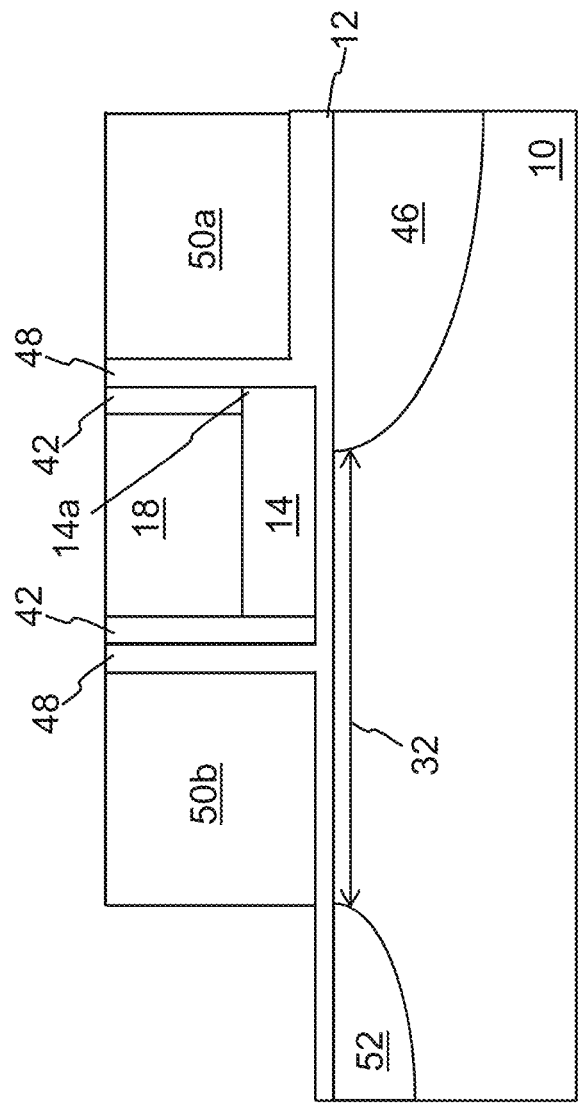
FIG. 2 is a cross sectional view of another alternate embodiment for forming a pair of memory cells of the present invention.

FIG. 2 illustrates an alternate embodiment of the process of FIGS. 1A-1I, wherein the spacer 42 formed over floating gate 14 in the inner region is left remaining before the formation of erase gate 50a (i.e., no inner region oxide etch), to simplify the fabrication process.

Figure 3A:
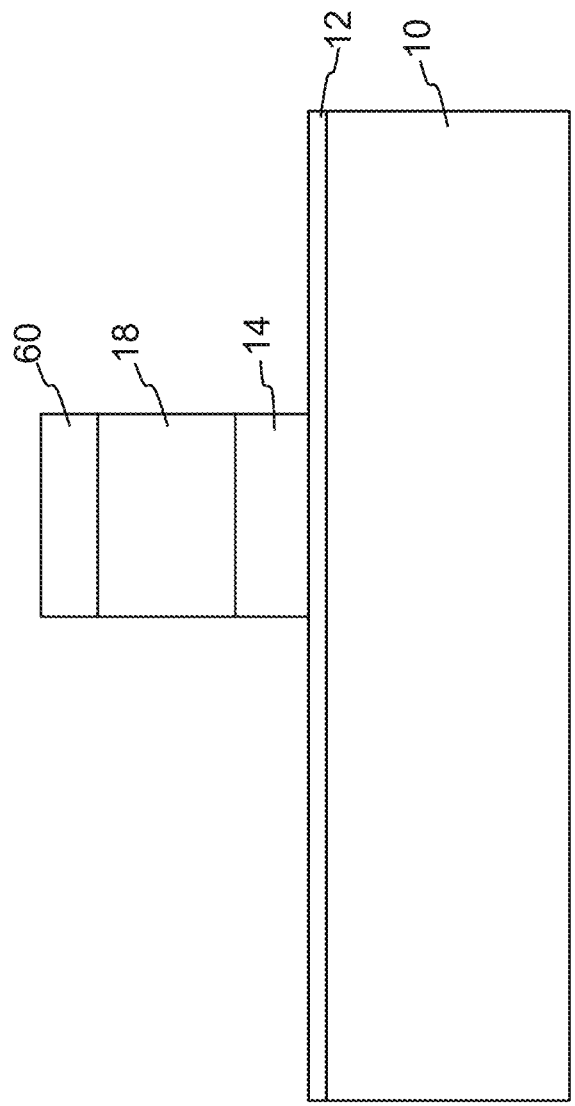
FIGS. 3A-3D are cross sectional views illustrating steps in another alternate embodiment for forming a pair of memory cells of the present invention.
Figure 3B:
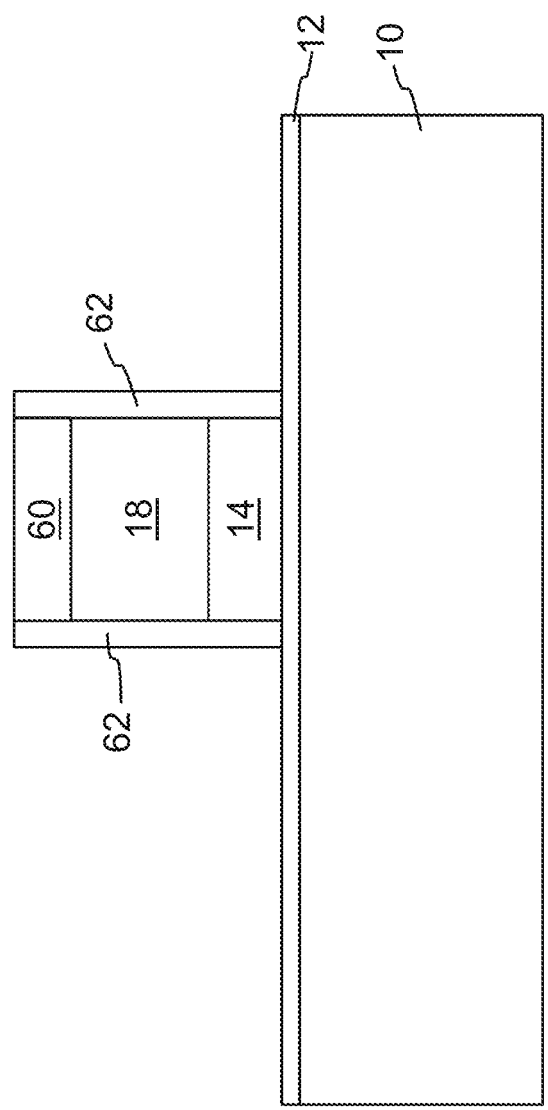
Figure 3C:
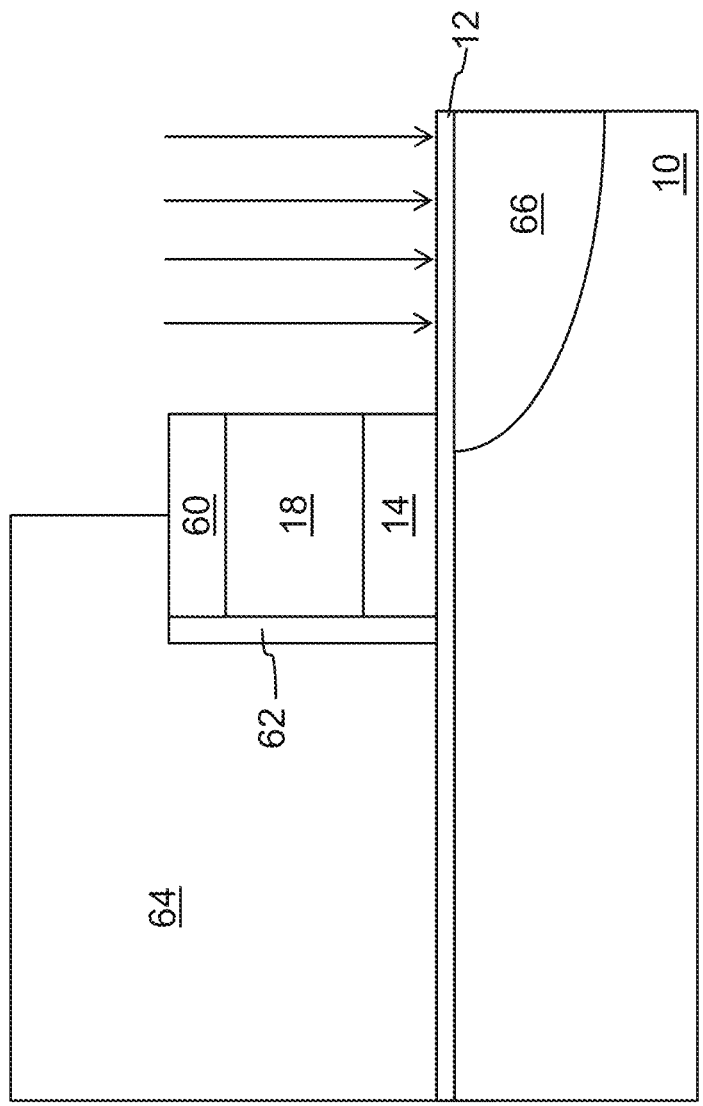
Figure 3D:
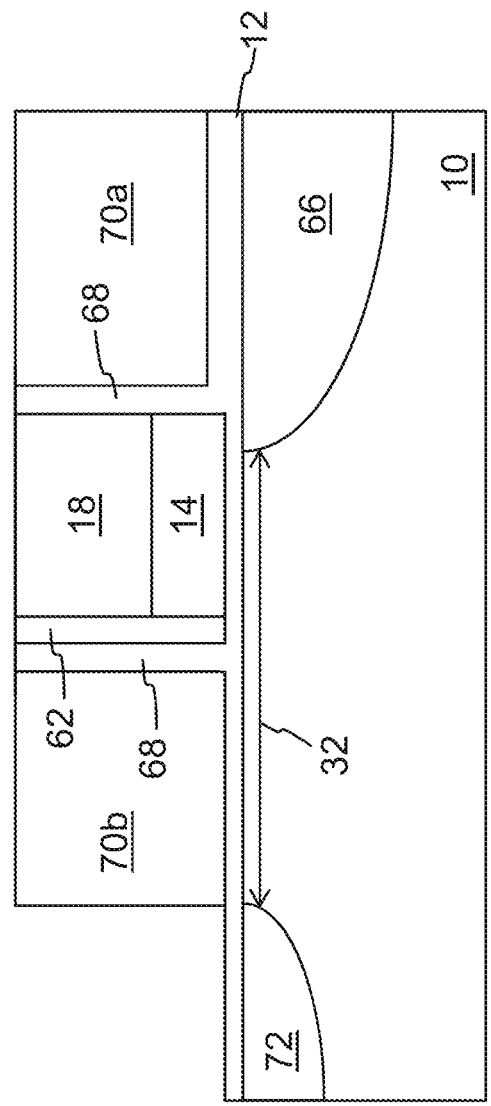

FIGS. 3A-3D illustrate yet another alternate embodiment of the process of FIGS. 1A-1I, wherein the process begins with the same processing steps described above and illustrated in FIG. 1A. However, unlike the poly etch that only removes the exposed portions of poly layer 14 in the outer regions as shown in FIG. 1C, a poly etch is used to remove the poly layer 14 in both the inner and outer regions as shown in FIG. 3A. Preferably, an additional oxide layer 60 is formed on nitride blocks 18. Insulation spacers 62 (e.g. composite, formed of both oxide and nitride, or just oxide) are formed along the sides of nitride block 18 and poly layer 14, as shown in FIG. 3B. Photoresist 64 is formed on the structure, and removed from the inner region. The exposed ON or oxide spacer 62 is removed by nitride/oxide etch. An implant process is then used to form source region 66, as shown in FIG. 3C. After photoresist removal, an oxide layer 68 is formed over the structure. A poly deposition, CMP and poly etch are then performed to form the erase gate 70a and word line gate 70b. An implant is then used to form drain 72. The final structure is shown in FIG. 3D. With this embodiment, the spacing between the erase gate 70a and the floating gate 14 and nitride block 18 is dictated solely by oxide layer 68.

Figure 4B:
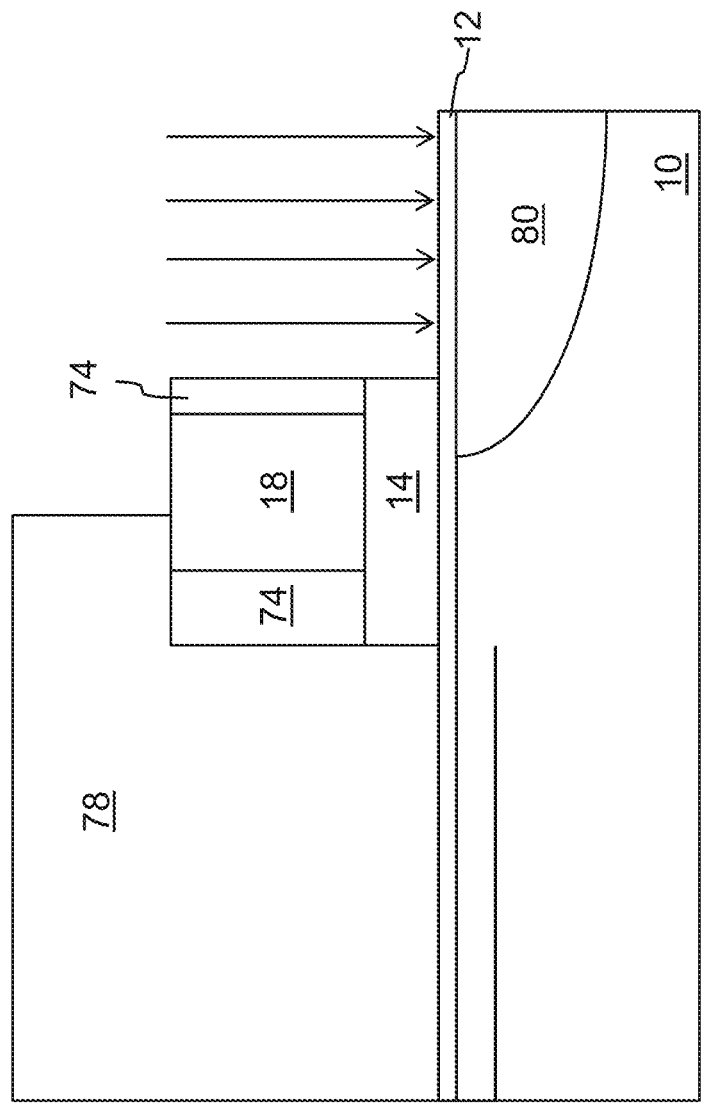
Figure 4C:
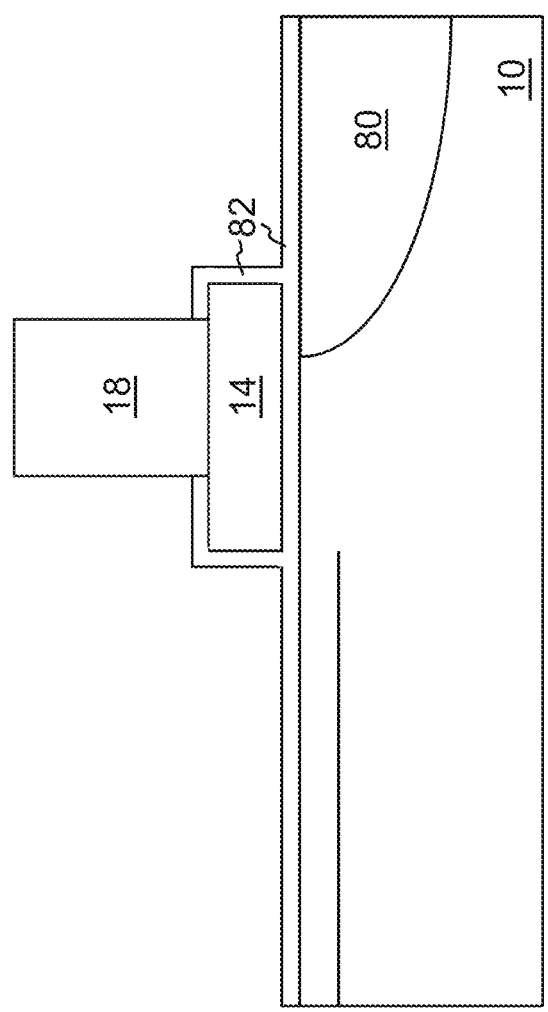
Figure 4D:
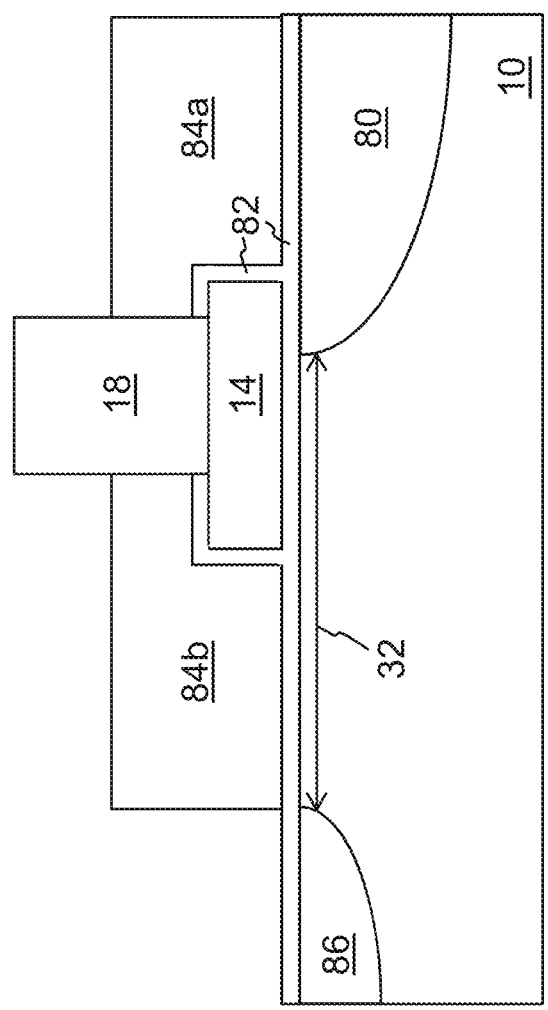

FIGS. 4A-4D illustrate yet another alternate embodiment of the process of FIGS. 1A-1I, wherein the process begins with the same processing steps described above and illustrated in FIG. 1A. Spacers 74 of insulation material (e.g. oxide) are formed on both sides of nitride block 18. Photo resist 76 is formed on the structure, and selectively removed from the outer regions. A poly etch is used to remove the exposed portions of poly layer 14. A WLVT implantation is used to implant the substrate in the outer regions, as illustrated in FIG. 4A. After photoresist removal, photoresist 78 is formed on the structure, and selectively removed from the inner region. An oxide wet etch is performed to thin the exposed spacers 74 in the inner region (to independently control the eventual overlap of the erase gate and the floating gate). A poly etch is then performed to remove the exposed portions of poly layer 14 in the inner region. An implant process is then performed to form source region 80, as shown in FIG. 4B. After photoresist removal, an oxide etch is performed to remove spacers 74 and exposed portions of oxide layer 12. A thermal oxidation process is used to form oxide layer 82 on the exposed surfaces of poly layer 14 and substrate 10, as illustrated in FIG. 4C. A poly deposition and etch are used to form erase gate 84a and word line gate 84b, and an implant is used to form drain region 86, as illustrated in FIG. 4D. Both the erase gate 84a and word line gate 84b have a first portion laterally adjacent to the floating gate and a second portion extending up and over the floating gate, for enhanced erase efficiency and capacitive coupling. The amount of floating gate overlap by the erase gate relative to the word line gate is independently controlled and dictated by the oxide spacer thinning step.

Figure 5A:
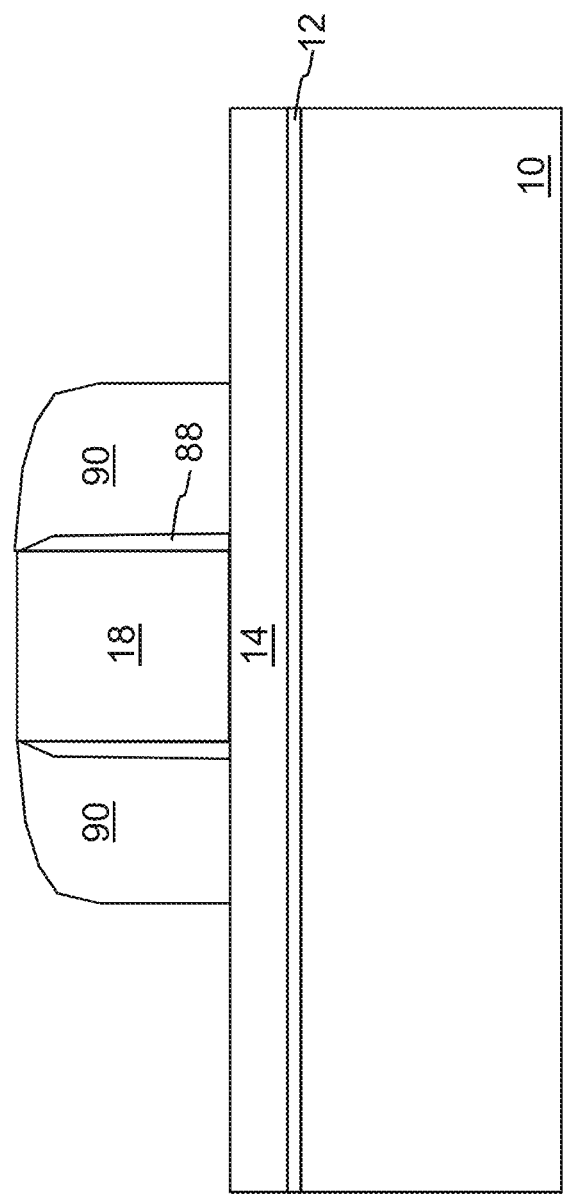
FIGS. 5A-5C are cross sectional views illustrating steps in another alternate embodiment for forming a pair of memory cells of the present invention.
Figure 5B:
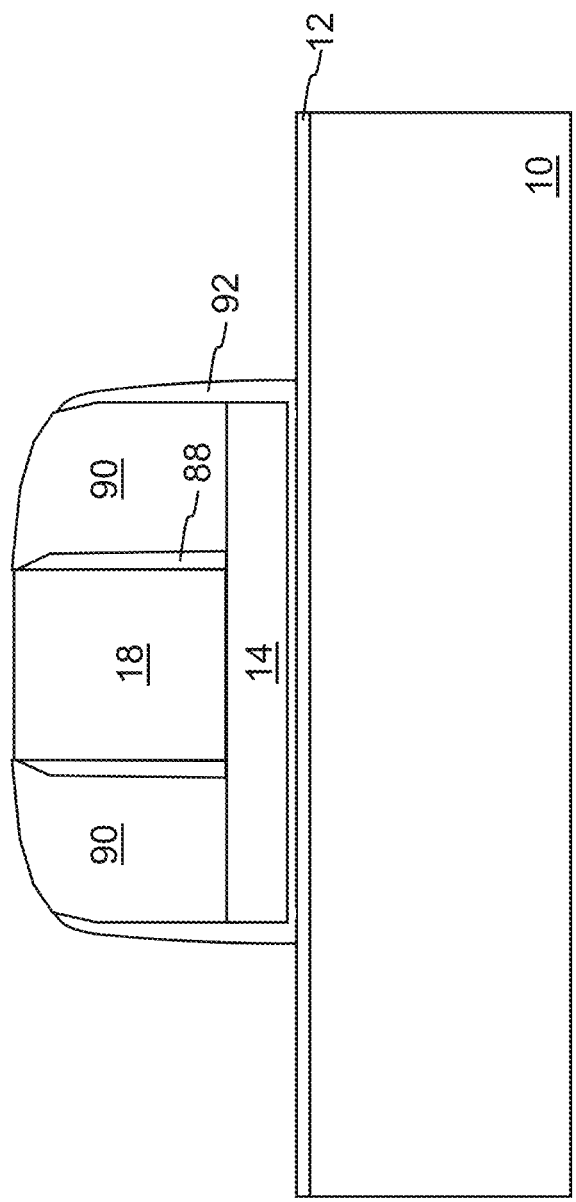
Figure 5C:
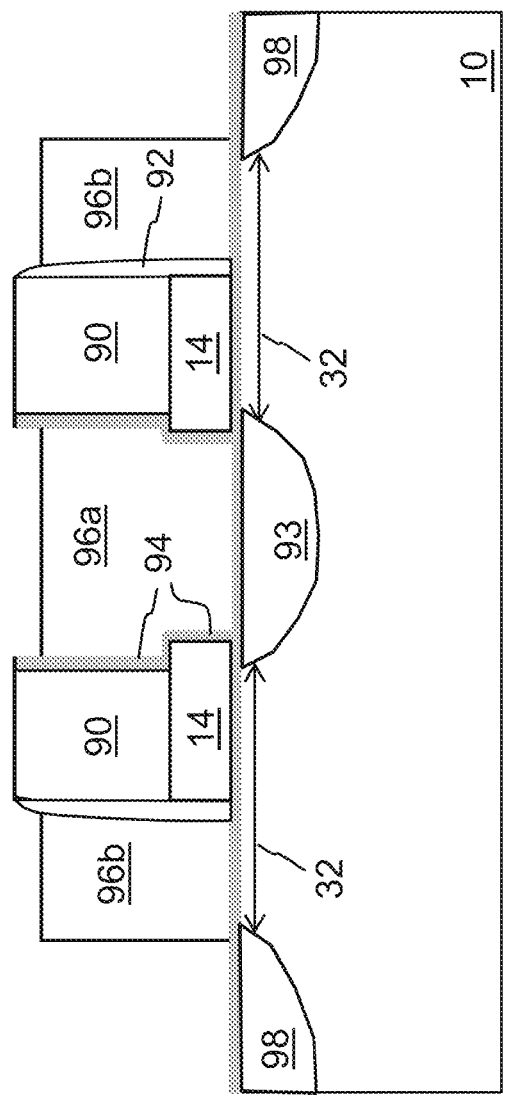

FIGS. 5A-5C illustrate yet another alternate embodiment of the process of FIGS. 1A-1I, wherein the process begins with the same processing steps described above and illustrated in FIG. 1A. However, in this embodiment, the erase gate replaces nitride block 18 instead of being formed next to it. Specifically, spacers 88 (optional) and 90 of insulation material (e.g. oxide-nitride for spacers 88 which is optional, and oxide for spacers 90) are formed on both sides of nitride block 18, as illustrated in FIG. 5A. A poly etch is used to remove those portions of poly layer 14 not protected by nitride block 18 and spacers 88 and 90. Spacers 92 of insulation material (e.g. oxide) are then formed on the sides of the structure, including the exposed ends of poly layer, as illustrated in FIG. 5B. A nitride etch is used to remove nitride block 18 leaving a trench behind and exposing a portion of the poly layer 14 at the bottom of the trench. A poly etch is used to remove the exposed portion of poly layer 14. An implant process is used to form source region 93. Spacers 88 are removed or thinned, or spacer 90 is thinned without optional spacer 88, and oxide 94 is formed along the sidewalls of the trench left behind by the removal of nitride block 18. A poly deposition and etch are performed to form erase gate 96a and word line gates 96b. An implant process is then used to form drain regions 98. The resulting structure is shown in FIG. 5C.

Figure 6:
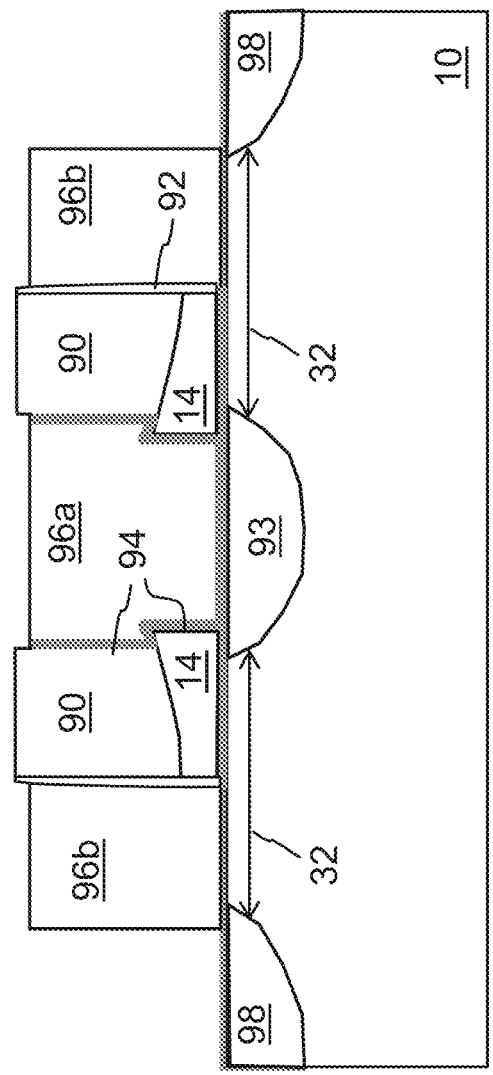
FIG. 6 is a cross sectional view of another alternate embodiment for forming a pair of memory cells of the present invention.

FIG. 6 illustrates an alternate embodiment of the process of FIGS. 5A-5C, wherein before spacers 90 are formed, a poly slope etch is performed so that the upper surface of poly layer 14 slopes downwardly as it extends away from nitride block 18. This results in each floating gate having an upwardly sloping surface terminating in a sharper edge that faces the notch of the erase gate.

Figure 7:
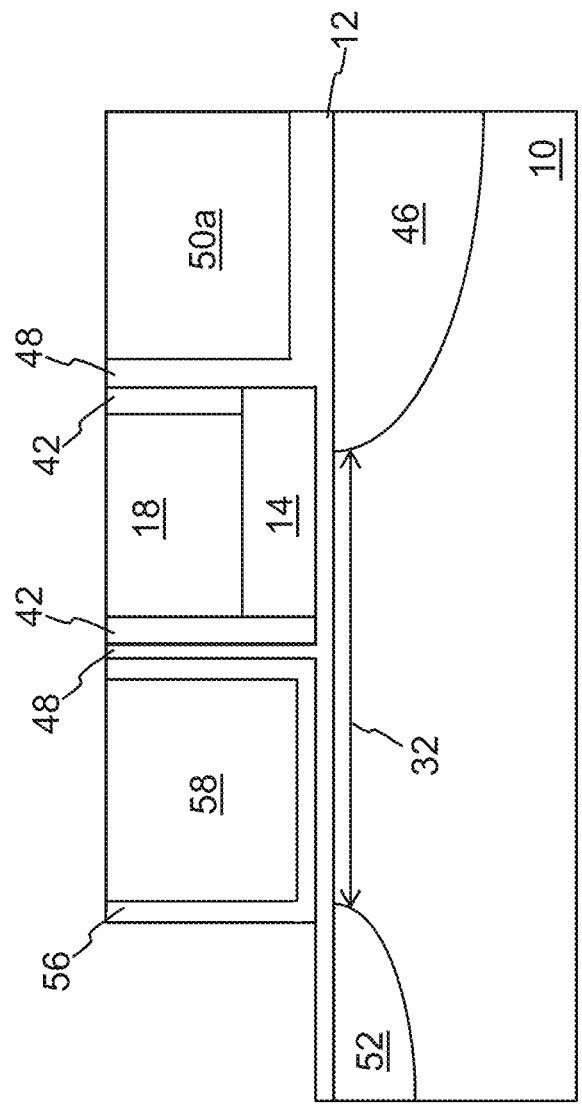
FIG. 7 is a cross sectional view of another alternate embodiment for forming a pair of memory cells of the present invention.

FIG. 7 illustrates another alternate embodiment of the processes of FIGS. 1-6, wherein the poly block that forms the word line gate is removed by poly etch, and replaced with an insulation layer of a high K material (i.e. having a dielectric constant K greater than that of oxide, such as HfO2, ZrO2, TiO2, etc.), and a block of metal material. For example, with respect to the embodiment of FIG. 2, poly block 50b is removed by poly etch, and replaced with an insulation layer 56 of a high K material and a block 58 of metal material, as shown in FIG. 7. By having the word line gate 58 formed of metal, greater gate conductivity can be achieved. The same can be done for poly block 26b in FIG. 1I, poly block 70b in FIG. 3D, poly block 84b in FIG. 4D, and poly block 96b in FIGS. 5C and 6.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. For example, nitride blocks 18 could instead be made of oxide or composite layers with oxide-nitride-oxide, or oxide-nitride. The insulator under the word line gates 26b, 50b, 70b, 84b, and 96b can be silicon oxide, or nitrogen treated oxide with NO, N2O anneal or DPN (decoupled plasma nitridation), and is not limited to these examples. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a non-volatile memory cell comprising:

forming a first insulation layer on a semiconductor substrate;

forming a first polysilicon layer on the first insulation layer in a first polysilicon deposition process;

forming an insulation block on the first polysilicon layer, the insulation block having a first side and a second side;

forming insulation spacers adjacent the first and second sides;

reducing a width of the insulation spacer adjacent the first side;

removing portions of the first polysilicon layer while maintaining a polysilicon block of the first polysilicon layer disposed under the insulation block and the insulation spacers adjacent the first and second sides of the insulation block;

forming a source region in the substrate adjacent the first side of the insulation block;

removing the insulation spacers to expose end portions of the polysilicon block of the first polysilicon layer;

forming a layer of insulation material that at least extends along the exposed end portions of the polysilicon block of the first polysilicon layer;

forming a second polysilicon layer over the substrate and the insulation block in a second polysilicon deposition process;

removing portions of the second polysilicon layer while maintaining a first polysilicon block and a second polysilicon block of the second polysilicon layer, wherein:
  the first polysilicon block of the second polysilicon layer is disposed adjacent the first side of the insulation block and over the source region,
  the second polysilicon block of the second polysilicon layer is disposed adjacent the second side of the insulation block; and forming a drain region in the substrate adjacent the second polysilicon block of the second polysilicon layer wherein:
  the first polysilicon block of the second polysilicon layer includes a first portion laterally adjacent to the polysilicon block of the first polysilicon layer, and a second portion that extends up and over the polysilicon block of the first polysilicon layer;
  the second polysilicon block of the second polysilicon layer includes a first portion laterally adjacent to the polysilicon block of the first polysilicon layer, and a second portion that extends up and over the polysilicon block of the first polysilicon layer.

2. The method of claim 1, wherein an amount of vertical overlap between the first polysilicon block of the second polysilicon layer and the polysilicon block of the first polysilicon layer is less than an amount of vertical overlap between the second polysilicon block of the second polysilicon layer and the polysilicon block of the first polysilicon layer.

3. The method of claim 1, wherein the insulation block is formed of nitride, oxide, or a composite of layers including both oxide and nitride.

4. The method of claim 1, wherein the first insulation layer is formed of oxide or nitrogen treated oxide.

5. The method of claim 1, further comprising:
  removing the second polysilicon block of the second polysilicon layer; and
  forming a metal block adjacent the second side of the insulation block.

6. The method of claim 5, further comprising:
  forming a layer of high-K insulation material between the metal block and the second side of the insulation block.

* * * * *